United States Patent [19]

Hisanaga et al.

[11] Patent Number: 4,992,724
[45] Date of Patent: Feb. 12, 1991

[54] BRIDGE BALANCING CIRCUIT

[75] Inventors: Tetsuo Hisanaga; Hiroshi Hatanaka, both of Kanagawa, Japan

[73] Assignee: Yamatake-Honeywell Co., Ltd., Tokyo, Japan

[21] Appl. No.: 481,893

[22] Filed: Feb. 20, 1990

[51] Int. Cl.$^5$ .......................... H03H 1/00; H03M 1/72
[52] U.S. Cl. ..................................... 323/367; 324/607; 324/706; 341/146
[58] Field of Search ............... 323/353, 354, 364, 365, 323/367; 318/663, 674; 341/144; 324/607, 706, 99 D

[56] References Cited

U.S. PATENT DOCUMENTS

| | | | |
|---|---|---|---|
| 3,577,075 | 5/1971 | Krygeris et al. | 324/99 D |
| 3,728,700 | 4/1973 | Duval | 324/99 D |
| 3,960,010 | 6/1976 | Gustafsson | 324/607 |
| 4,057,755 | 11/1977 | Piesche | 318/674 |
| 4,390,864 | 6/1983 | Ormond | 324/99 D |
| 4,549,073 | 10/1985 | Tamura et al. | 323/364 |
| 4,567,429 | 1/1986 | Livsey | 324/99 D |

Primary Examiner—Steven L. Stephan
Assistant Examiner—Nilay H. Vyas
Attorney, Agent, or Firm—Blakely, Sokoloff, Taylor & Zafman

[57] ABSTRACT

A bridge balancing circuit includes a bridge having a resistance change type sensor, a differential amplifier for extracting a voltage difference across two central nodes of the bridge, a comparator connected to the output terminal of the differential amplifier, a D/A converter an output terminal of which is connected to one of the two central nodes, and a controller for controlling the D/A converter. The differential amplifier and the comparator automatically detect a balanced point of the bridge, and the controller maintains a balanced state of the bridge.

1 Claim, 3 Drawing Sheets

4,992,724

BRIDGE BALANCING CIRCUIT

BACKGROUND OF THE INVENTION

The present invention relates to a circuit for balancing a bridge.

A circuit which employs a resistance change type sensor as a constituting element of a bridge, applies a voltage or current across two ends of the bridge, extracts signals from two central nodes, and determines a voltage difference between the two signals as a sensor output signal is widely used. In general, in order to compensate for an unbalanced state caused by a variation or a change in resistors constituting the bridge, a variable resistor is connected to the bridge.

FIG. 4 shows an example of such a circuit. In FIG. 4, resistance change type sensors RS1 and RS2 are constituting elements of a bridge, voltages $V_+$ and $V_-$ are applied across two ends of the bridge, signals are extracted from two central nodes, and a voltage difference between the two extracted signals is determined as a sensor output signal a. In order to compensate for an unbalanced state of the bridge, a variable resistor VR1 is connected to the bridge. Reference symbols R1 and R2 denote fixed resistors constituting the bridge.

However, it takes much time to adjust the variable resistor VR1, and the bridge balancing circuit employing the variable resistor is not suitable for mass-production. In addition, if the resistance is changed over time after adjustment, the bridge is unbalanced again.

SUMMARY OF THE INVENTION

It is therefore an object of the present invention to provide a bridge balancing circuit which can automatically adjust a bridge balance without adjusting a variable resistor.

In order to achieve the above object of the present invention, there is provided a bridge balancing circuit comprising a bridge having a resistance change type sensor, a differential amplifier for extracting a voltage difference across two central nodes of the bridge, a comparator connected to an output terminal of the differential amplifier, a D/A converter an output terminal of which is connected to one of the two central nodes, and a controller for controlling the D/A converter, wherein the differential amplifier and the comparator automatically detect a balanced point of the bridge, and the controller maintains a balanced state of the bridge.

DESCRIPTION OF THE PREFERRED EMBODIMENT

Figure 1:
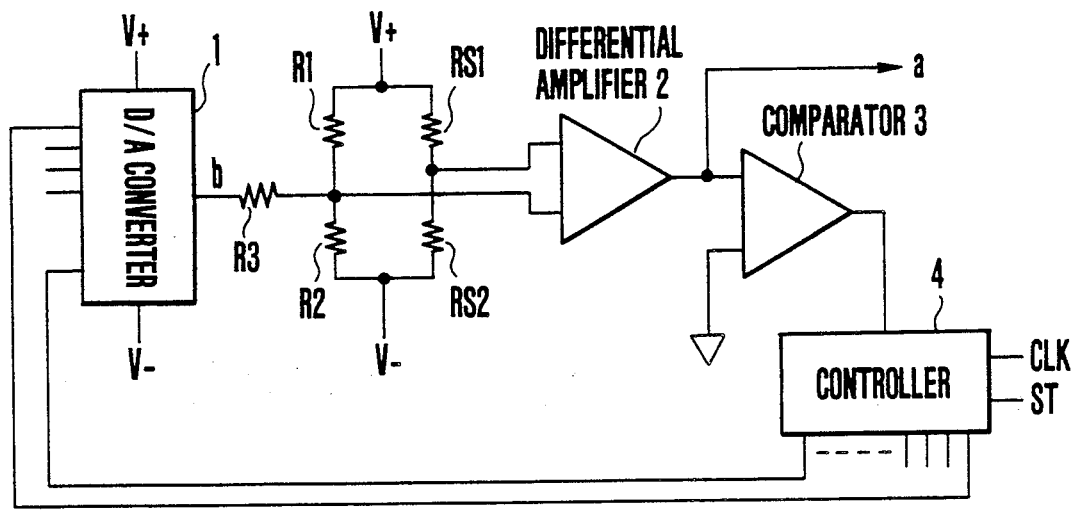
FIG. 1 is a circuit diagram showing an embodiment of a bridge balancing circuit according to the present invention.
Figure 4:
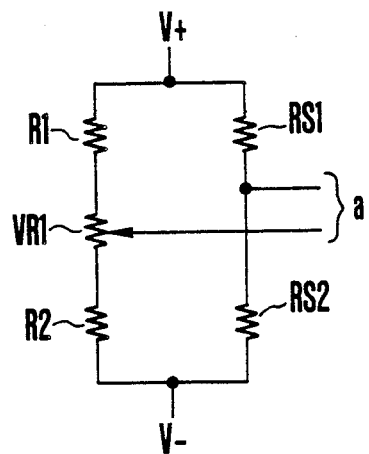
FIG. 4 is a circuit diagram showing a conventional bridge balancing circuit.

FIG. 1 shows an embodiment of a bridge balancing circuit according to the present invention. In FIG. 1, reference numeral 1 denotes a D/A converter; 2, a differential amplifier; 3, a comparator; 4, a controller for receiving a clock signal CLK and a start signal ST; and R3, a fixed resistor. The same reference numerals in FIG. 1 denote the same parts as in FIG. 4. The D/A converter 1 is controlled by a control signal output from the controller 4 which receives the output signal of the comparator 3, and outputs a D/A output signal b.

Figure 2:
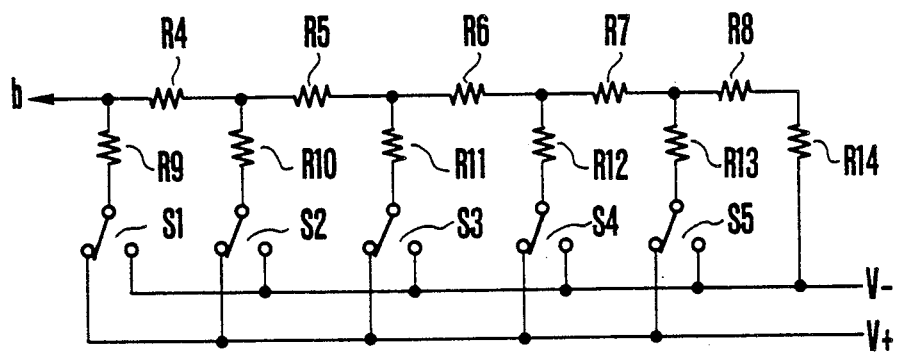
FIG. 2 is a circuit diagram showing a D/A converter constituting the circuit shown in FIG. 1.

The D/A converter 1 shown in FIG. 1 comprises a ladder circuit constituted by resistors R4 to R8 and R14 (resistance r) and resistors R9 to R13 (resistance 2R), and analog switches S1 to S5 which are controlled by a control signal from the controller 4, as shown in FIG. 2. The D/A converter shown in FIG. 2 can process 5-bit data, and the D/A output signal b causes to generate a voltage between a voltage $V_+$ and $31/32 \cdot \{(V_-)-(V_+)\}+(V_+)$ in accordance with an input code.

The comparator 3 is used to detect a bridge balanced point. In one method of detecting the balanced point, an input code of the D/A converter 1 is counted up in turn from "0", and the count-up operation is stopped when the output signal from the comparator 3 is inverted. In another method, judgment is sequentially made to determine bits from the MSB up to the LSB of the D/A converter 1 like in a sequential comparison type A/D converter. As compared to the former method, the latter method can shorten an average time until a balanced point is detected.

Figure 3:
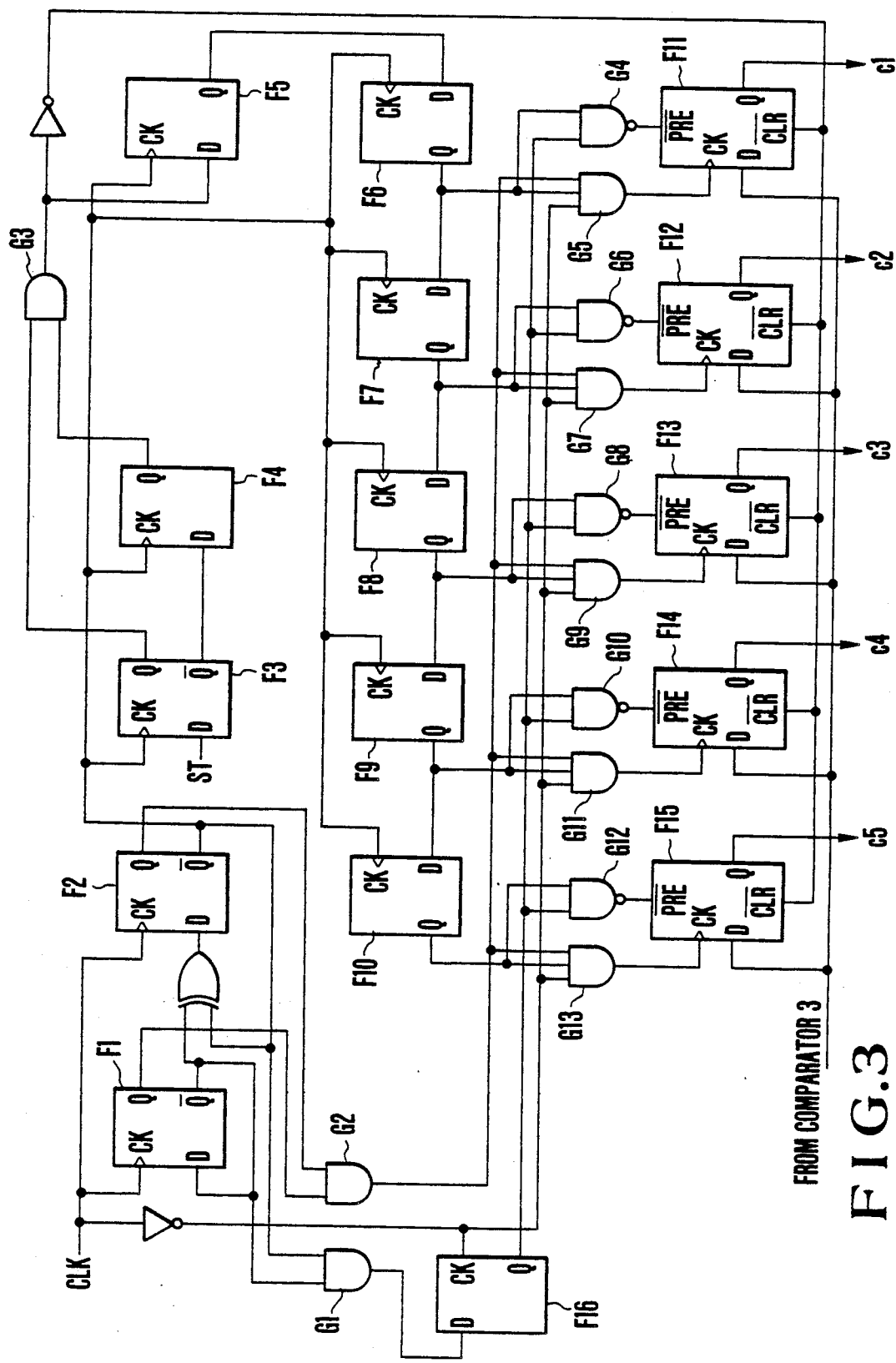
FIG. 3 is a circuit diagram of a controller constituting the circuit shown in FIG. 1.

FIG. 3 shows the controller employing the latter method. The controller starts its operation when the start signal ST goes from "L" level to "H" level. The controller stops its operation and holds its state when all the bits are determined. In FIG. 3, reference symbols F1 to F16 denote flip-flops; G1 to G3, G5, G7, G9, G11 and G13, AND gates; and G4, G6, G8, G10 and G12, NAND gates. The flip-flops F1 and F2 receive the clock signal CLK, and the flip-flop F3 receives the start signal ST. The controller outputs control signals c1 (MSB) to c5 (LSB) in accordance with a signal from the comparator 3.

Figure 5:
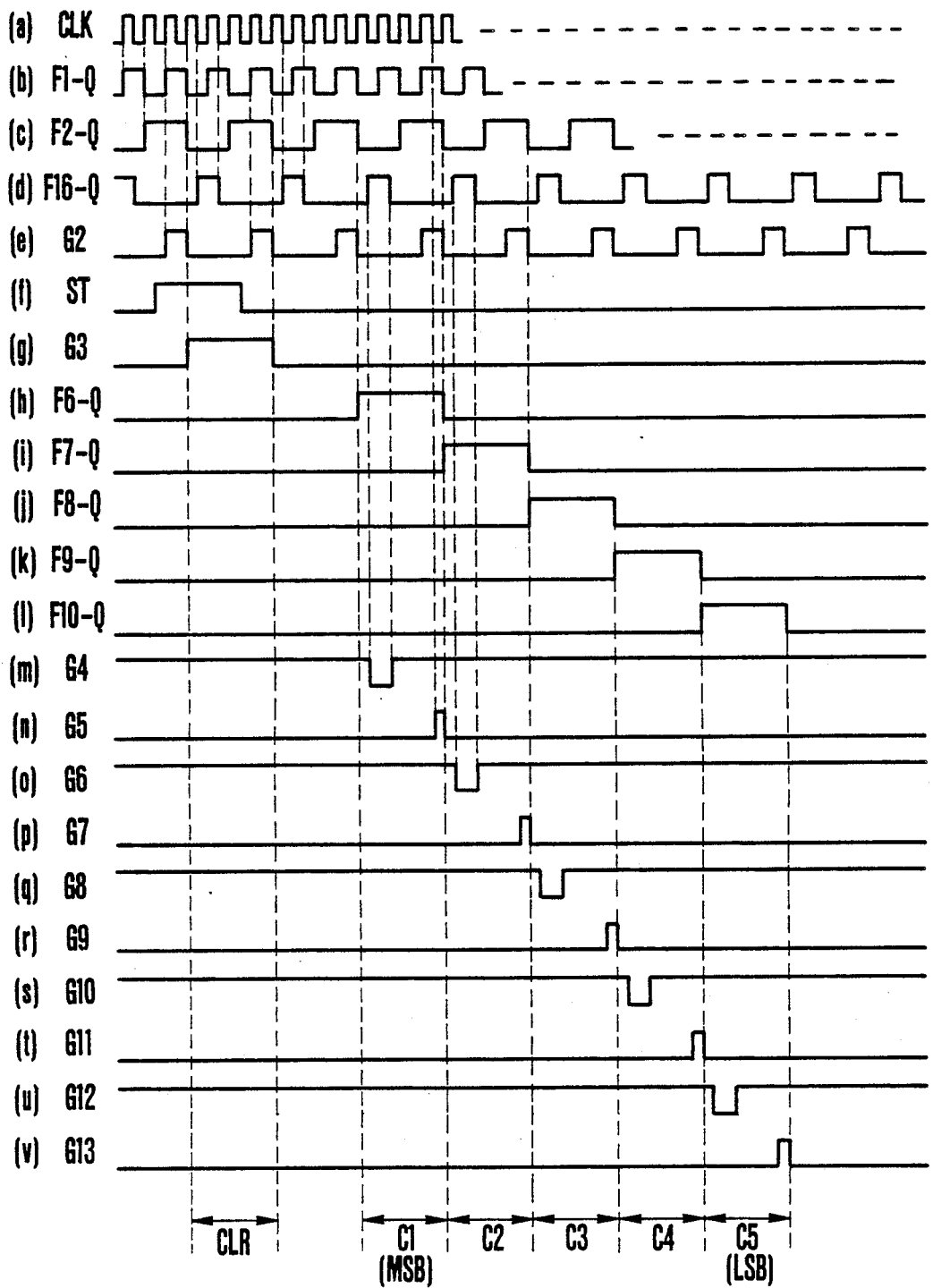
FIGS. 5(a) to 5(v) are timing charts of respective portions of a controller 4.

The operation of the controller will be described in detail below with reference to the timing charts of FIGS. 5(a) to 5(v). In response to the input clock signal CLK as shown in FIG. 5(a), the Q outputs of the flip-flops F1 and F2 are changed, as shown in FIGS. 5(b) and 5(c). As a result, the Q output of the flip-flip F16 and the output of the AND gate G2 are changed, as shown in FIGS. 5(d) and 5(e). When the start signal ST goes from "L" level to "H" level, as shown in FIG. 5(f), the output of the AND gate G3 is changed two clocks later, as shown in FIG. 5(g). In response to this output signal, the flip-flops F11 to F15 are cleared (CLR). At the same time, the Q output of the flip-flop F6 goes to "H" level through the flip-flop F5, as shown in FIG. 5(h), to activate the NAND gate G4 and the AND gate G5 respectively connected to the CK and PRE terminals of the flip-flop F11. In this case, in response to the "H"-level Q output of the flip-flop F16, the output of the NAND gate G4 goes to "L" level, as shown in FIG. 5(m), and the flip-flop F11 is set in a preset state. As a result, the control signal c1 (MSB) of the Q output of the flip-flop F11 goes to "H" level, and controls the D/A converter 1 to output the following voltage as the MSB signal.

$$V_O = V_-' = \tfrac{1}{2}(V_+ - V_-)$$

When the control signal c1 is output in this manner, the comparator 3 judges whether the output from the differential amplifier 2 is positive or negative. If the output from the differential amplifier 2 is positive, the output from the comparator 3 goes to "L" level. This signal is input to the D terminal of the flip-flop F11. The flip-flop F11 is latched at a timing when the output from the AND gate G5 goes to "H" level, as shown in FIG. 5(n), thus determining, e.g., "L" level as the control signal c1.

The "H"-level Q output of the flip-flop F6 goes to "L" level after four periods of the clock signal, and at the same time, the Q output of the flip-flop F7 constituting a shift register together with the flip-flop F6 goes to "H" level, as shown in FIG. 5(i). Thus, the level of the control signal c2 of the Q output of the flip-flop F12 as the next lower bit of the MSB is determined in the same manner as in the flip-flop F11.

Similarly, the level of the control signal c5 (LSB) of the flip-flop F15 is determined. The determined levels of the control signals c1 to c5 are held until the next start signal is input. The output of the D/A converter 1 in this case is as follows:

$$V_0 = (V_+) + 1/2\{(V_-) - (V_+)\} \times c1 + 1/4\{(V_-) - (V_+)\} \times c2 + 1/8\{(V_-) - (V_+)\} \times c3 + 1/16\{(V_-) - (V_+)\} \times c4 + 1/32\{(V_-) - (V_+)\} \times c5$$

Note that c1 to c5 are set to be "1" when they are at "H" level, and are set to be "0" when they are at "L" level.

As described above, according to the present invention, a bridge balanced point is automatically detected to maintain a bridge balanced state. Thus, a bridge need not be balanced by adjusting a variable resistor unlike in a conventional bridge balancing circuit. The bridge balancing circuit of the present invention is suitable for mass-production, and can eliminate a variation caused by subjectivity of each person when the circuit is manually adjusted. In addition, the circuit of the present invention can be free from an unbalanced state even if resistances are changed over time. Therefore, no strict resistance variation precision of resistors constituting the bridge is required.

What is claimed is:
1. A bridge balancing circuit comprising:
   a bridge having a resistance change type sensor;
   a differential amplifier for extracting a voltage difference across two central nodes of said bridge;
   a comparator connected to an output terminal of said differential amplifier;
   a D/A converter an output terminal of which is connected to one of said two central nodes; and
   a controller for controlling said D/A converter,
   wherein said differential amplifier and said comparator automatically detect a balanced point of said bridge, and said controller maintains a balanced state of said bridge.

* * * * *

UNITED STATES PATENT AND TRADEMARK OFFICE
CERTIFICATE OF CORRECTION

PATENT NO. : 4,992,724
DATED : February 12, 1991
INVENTOR(S) : Hisanaga et al

It is certified that error appears in the above-indentified patent and that said Letters Patent is hereby corrected as shown below:

| | | |
|---|---|---|
| col, 01, line 22 | delete "signal a" | insert --signal $\underline{a}$-- |
| col. 02, line 56 | delete "PRE" | insert --$\overline{PRE}$-- |
| col. 02, line 62 | delete "cl" | insert --c1-- |
| col. 02, line 66 | delete "=" (2nd occurrence) | insert --+-- |
| col. 03, line 01 | delete "cl" | insert --c1-- |
| col. 03, line 21 | delete "cl" | insert --c1-- |
| col. 04, line 19 | after "sensor" | insert --said bridge having at least two nodes-- |
| col. 04, line 21 | delete "central" | |

Signed and Sealed this

Seventh Day of December, 1993

Attest:

BRUCE LEHMAN

*Attesting Officer*   *Commissioner of Patents and Trademarks*